United States Patent
Sherpa et al.

(10) Patent No.: US 10,818,507 B2
(45) Date of Patent: Oct. 27, 2020

(54) METHOD OF ETCHING SILICON NITRIDE LAYERS FOR THE MANUFACTURE OF MICROELECTRONIC WORKPIECES

(71) Applicant: Tokyo Electron Limited, Minato-ku, Tokyo (JP)

(72) Inventors: Sonam D. Sherpa, Albany, NY (US); Alok Ranjan, Austin, TX (US)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/378,730

(22) Filed: Apr. 9, 2019

(65) Prior Publication Data

US 2019/0348295 A1 Nov. 14, 2019

Related U.S. Application Data

(60) Provisional application No. 62/670,472, filed on May 11, 2018, provisional application No. 62/689,312, filed on Jun. 25, 2018.

(51) Int. Cl.

| H01L 21/311 | (2006.01) |
| H01L 21/768 | (2006.01) |
| H01L 29/16 | (2006.01) |
| H01L 21/02 | (2006.01) |

(52) U.S. Cl.
CPC .... *H01L 21/31116* (2013.01); *H01L 21/0217* (2013.01); *H01L 21/76829* (2013.01); *H01L 29/16* (2013.01)

(58) Field of Classification Search
CPC .......... H01L 21/0217; H01L 21/31116; H01L 21/76892; H01L 29/16
USPC ......................................... 438/706, 724, 744
See application file for complete search history.

(56) References Cited

U.S. PATENT DOCUMENTS

| 9,899,515 B1* | 2/2018 | Cheng ................. H01L 29/7827 |
| 2018/0076083 A1* | 3/2018 | Ko ..................... H01L 21/76213 |
| 2018/0138049 A1* | 5/2018 | Ko ....................... H01L 21/0223 |
| 2018/0269070 A1* | 9/2018 | Eason ................. H01J 37/32522 |
| 2019/0165099 A1* | 5/2019 | Chen .................. H01L 21/02576 |

* cited by examiner

*Primary Examiner* — Binh X Tran
(74) *Attorney, Agent, or Firm* — Rothwell, Figg, Ernst & Manbeck, P.C.

(57) ABSTRACT

Embodiments provide isotropic and selective etching of silicon nitride layers for the manufacture of microelectronic workpieces through sequential exposure of silicon nitride layers to plasma including hydrogen radicals and plasma including fluorine radicals. For example, the sequential application of plasma etch steps can use: (1) a first plasma gas including hydrogen ($H_2$) and argon (Ar), and (2) a second plasma gas including nitrogen trifluoride ($NF_3$), oxygen ($O_2$), and Ar. These plasma gases are ignited within a processing region or chamber under sufficient pressure to generate the hydrogen radicals and the fluorine radicals. Other plasma gas chemistries can also be used under sufficient pressures to generate alternating application of hydrogen radicals and fluorine radicals.

21 Claims, 9 Drawing Sheets

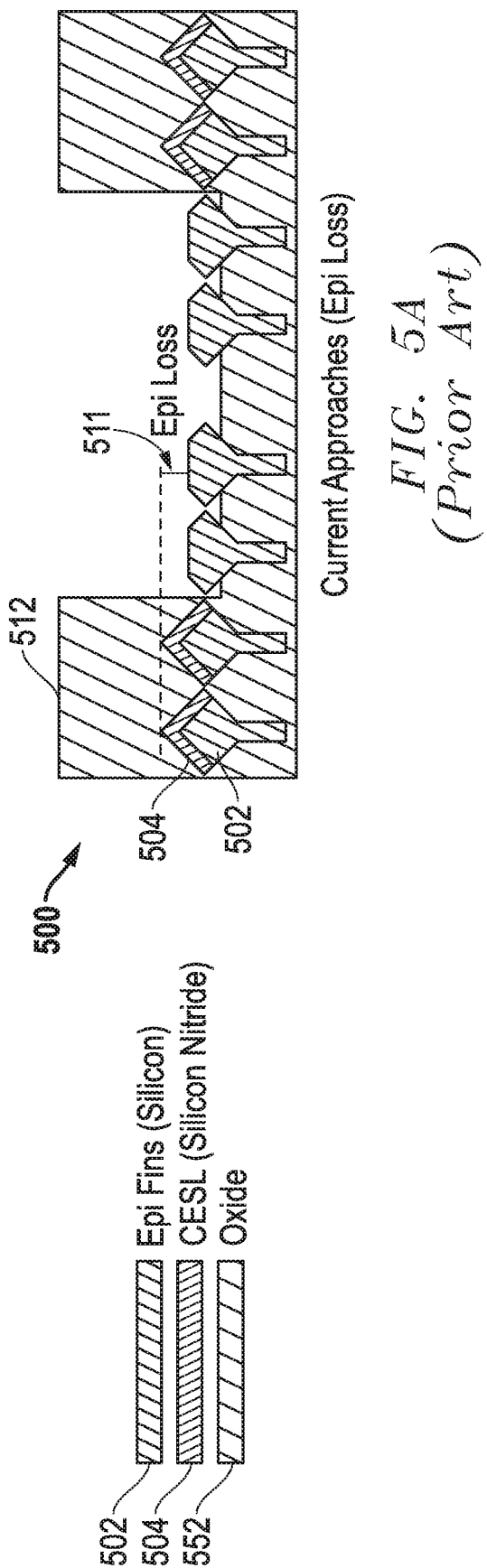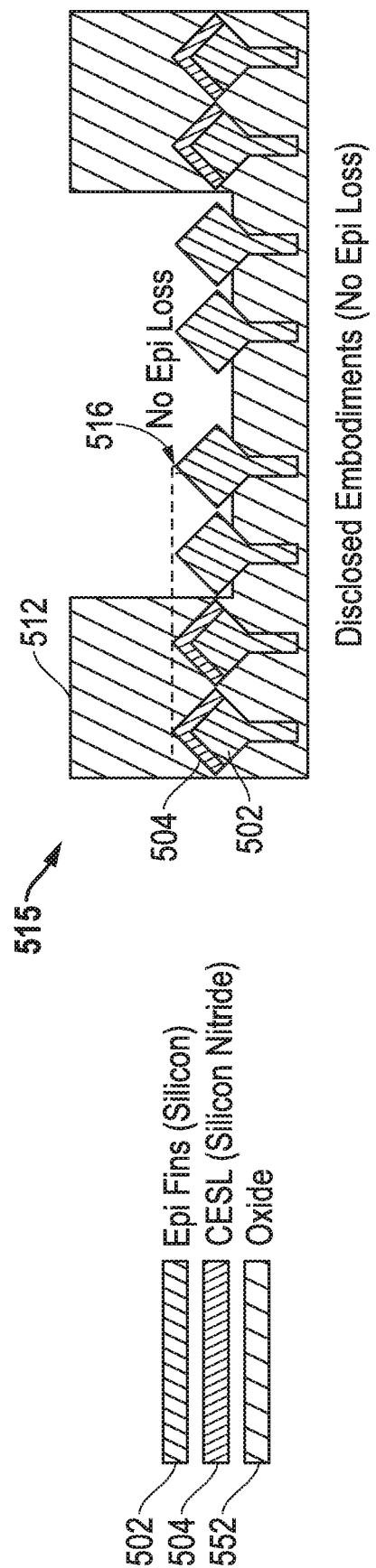

METHOD OF ETCHING SILICON NITRIDE LAYERS FOR THE MANUFACTURE OF MICROELECTRONIC WORKPIECES

RELATED APPLICATIONS

This application claims priority to the following provisional applications: U.S. Provisional Patent Application Ser. No. 62/670,472, filed May 11, 2018, and entitled "METHOD OF ETCHING SILICON NITRIDE ENCAPSULATION LAYER" and U.S. Provisional Patent Application Ser. No. 62/689,312, filed Jun. 25, 2018, and entitled "METHOD OF ETCHING SILICON NITRIDE LAYERS FOR THE MANUFACTURE OF MICROELECTRONIC WORKPIECES" which are hereby incorporated by reference in their entirety.

BACKGROUND

The present disclosure relates to methods for the manufacture of microelectronic workpieces, and in particular, methods to etch material layers on microelectronic workpieces.

Device formation within microelectronic workpieces typically involves a series of manufacturing techniques related to the formation, patterning, and removal of a number of layers of material on a substrate. To meet the physical and electrical specifications of current and next generation semiconductor devices, processing flows are being requested to reduce feature size while maintaining structure integrity for various patterning processes.

Silicon (Si), silicon oxide ($SiO_2$), and other materials are commonly encapsulated or protected by a silicon nitride (SiN) layer. For subsequent processes, it is often preferred that the silicon nitride layer be isotropically and selectively etched with respect to underlying silicon, silicon oxide, and other materials. For example, fabrication of nanosheet FETs (field effect transistors) typically require the removal of silicon nitride spacers with etch processes that are selective to silicon channel regions that are encapsulated by the silicon nitride spacers. Likewise, a contact etch stop layer (CESL) on epitaxial semiconductor material (epi) fins and/or along a gate sidewall is typically required to be removed with a highly selective etch. For example, a loss of less than 3 nanometers (nm) of material from epi fins is often required. In addition, removal of CESL residues from valleys situated between epi diamond structures can be a significant challenge for certain process flows. Other manufacturing processes for microelectronic workpieces can also have requirements for highly selective removal of silicon nitride layers in order to achieve desired results.

SUMMARY

Embodiments are described herein that provide isotropic and selective etching of silicon nitride layers for the manufacture of microelectronic workpieces. In particular, the disclosed embodiments use processes that etch silicon nitride isotropically and selectively through sequential exposure of silicon nitride layers to plasma including hydrogen radicals and plasma including fluorine radicals. For example, the sequential application of plasma etch steps can use: (1) a first plasma gas including hydrogen ($H_2$) and argon (Ar), and (2) a second plasma gas including nitrogen trifluoride ($NF_3$), oxygen ($O_2$), and Ar. These plasma gases can be ignited within a processing region or chamber under sufficient pressure to generate the hydrogen radicals and the fluorine radicals. Other plasma gas chemistries can also be used under sufficient pressures to generate alternating application of hydrogen radicals and fluorine radicals. Different or additional features, variations, and embodiments can also be implemented, and related systems and methods can be utilized as well.

For one embodiment, a method of processing microelectronic workpieces is disclosed including igniting a first plasma gas within a processing chamber at a first pressure sufficient to generate hydrogen radicals, delivering the hydrogen radicals to a silicon nitride layer formed on a substrate for a microelectronic workpiece positioned within the processing chamber to form modified silicon nitride, igniting a second plasma gas within the processing chamber at a second pressure sufficient to generate fluorine radicals, and delivering the fluorine radicals to the modified silicon nitride to remove the modified silicon nitride.

In additional embodiments, the first pressure is 300 milliTorr (mTorr) or greater. In further embodiments, the first plasma gas includes hydrogen ($H_2$) and argon (Ar). In still further embodiments, the ratio of $H_2$ to Ar within the first plasma gas is 700/800 and the pressure is 500 mTorr or greater.

In additional embodiments, the second pressure is 300 mTorr or greater. In further embodiments, the second plasma gas includes oxygen ($O_2$), nitrogen trifluoride ($NF_3$), and argon (Ar). In still further embodiments, the ratio of $O_2$ to $NF_3$ is at least one of a ratio greater than four such that $O_2/NF_3>4$ or a ratio between 2 and 5 such that $2 \leq O_2/NF_3 \leq 5$.

In additional embodiments, a duration for the allowing hydrogen radicals to modify the silicon nitride layer is controlled to determine an amount of the silicon nitride layer that is modified to form the modified silicon nitride. In further embodiments, the duration is 15 seconds or more.

In additional embodiments, a duration of the fluorine radicals to remove the modified silicon nitride is controlled so that all of the modified silicon nitride is removed.

In additional embodiments, the substrate also includes a silicon layer. In further embodiments, an etch selectivity for the modified silicon nitride to the silicon layer is at least 30 or greater while the fluorine radicals are allowed to remove the modified silicon nitride.

In additional embodiments, the method further includes evacuating the first plasma gas from the processing chamber and injecting the second plasma gas into the processing chamber prior to the igniting of the second plasma gas.

In additional embodiments, the silicon nitride layer is formed as at least one of an encapsulation layer or a liner to protect a different material layer on the substrate. In further embodiments, the different material layer is at least one of a silicon oxide layer or a silicon layer.

In additional embodiments, the silicon nitride layer is formed to provide a spacer for a nanosheet field effect transistor. In further embodiments, the silicon nitride layer for the spacer includes silicon carbonitride/boron nitride (SiBCN).

In additional embodiments, the silicon nitride layer is formed as a contact etch stop layer (CESL) to protect a fin structure. In further embodiments, the fin structure includes epitaxial silicon.

In additional embodiments, the igniting and delivering are repeated to determine an amount of etching applied to the silicon nitride layer.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

FIG. 5A (Prior Art) is a diagram of an example embodiment for a current process that etches a silicon nitride layer that is used as a contact etch stop layer (CESL).

FIG. 5B is a diagram of an example embodiment for a process according to the embodiments described herein that etches a silicon nitride layer used as a CESL.

DETAILED DESCRIPTION

As described herein, selective and isotropic etch of silicon nitride is achieved by sequentially applying a plasma including hydrogen radicals and a plasma including fluorine radicals. Further, the etch rate of silicon nitride can be controlled by adjusting and/or optimizing the hydrogen plasma conditions. The process is also highly, if not infinitely, selective to silicon oxide. Still further, the etch rate of any exposed silicon materials during the plasma etch including fluorine radicals is negligible (e.g., about 1 Angstrom (Å) or less per 15 seconds). Therefore, an over-etch step can be added to clear residues with minimum risk of silicon etch. Other advantages can also be achieved while still taking advantage of the process techniques described herein.

Figure 1A:
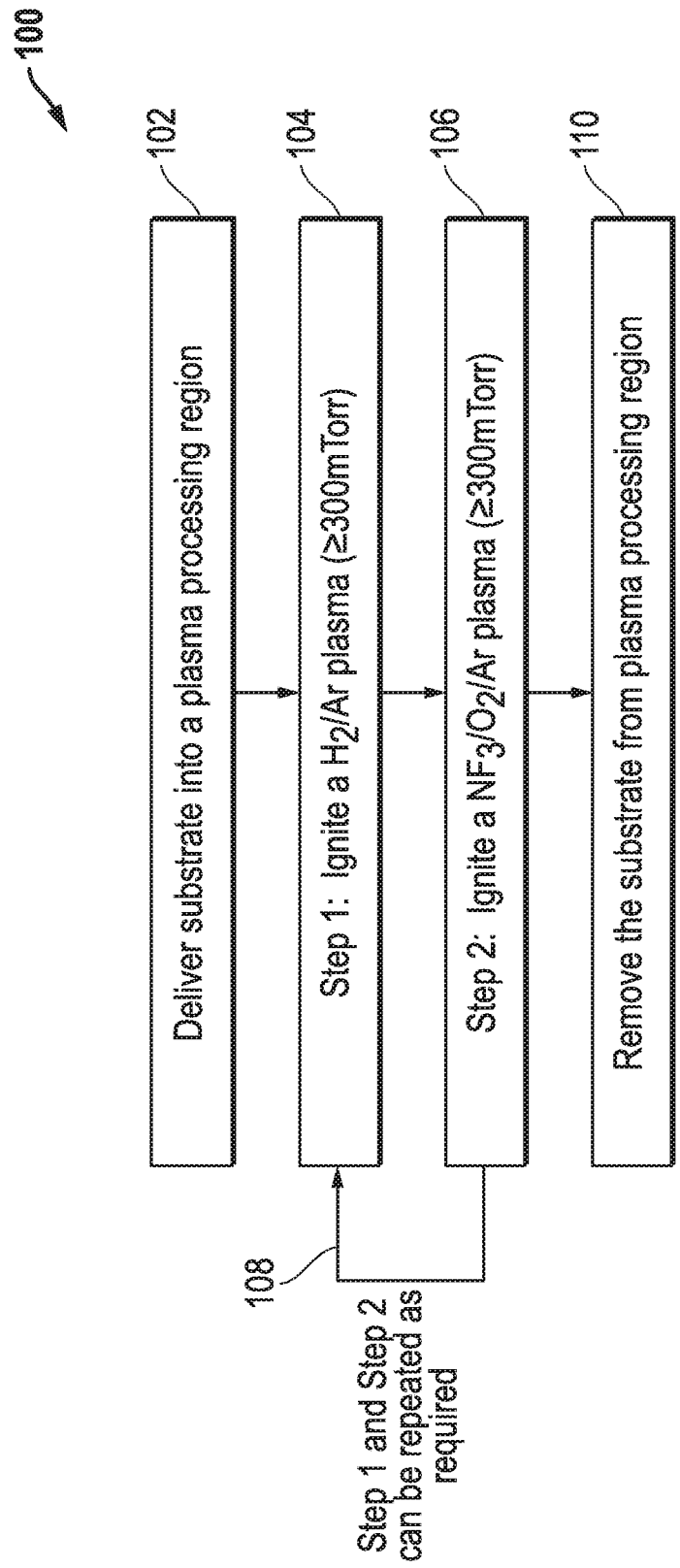
FIG. 1A is a process flow diagram of an example embodiment where silicon nitride is isotropically and selectively etched through the sequential application of plasma etch steps including a plasma including hydrogen radicals (Step 1) and a plasma including fluorine radicals (Step 2).

FIG. 1A is a process flow diagram of an example embodiment 100 where silicon nitride is isotropically and selectively etched through the sequential application of plasma etch steps including a plasma including hydrogen radicals and a plasma including fluorine radicals. In block 102, a substrate for a microelectronic workpiece is delivered into a plasma processing region. In block 104, a first process step is performed (Step 1). For this first process step, a plasma gas including $H_2$ and Ar is flowed into the processing region and ignited. A pressure sufficient to cause hydrogen radicals to be formed from the plasma gas chemistry is also applied within the processing region. For example, a pressure of 300 milli-Torr (mTorr) or more can be applied within the processing region. As described herein, the hydrogen radicals within the plasma cause a surface modification to silicon nitride layers to form modified silicon nitride. The plasma processing for this first process step is then stopped, and the processing region is evacuated to remove the plasma gas. It is further noted that the surface modification to the silicon nitride layers during this first process step (Step 1) causes an increase in reactivity of silicon nitride toward fluorine radicals.

In block 106, a second process step is performed (Step 2). For this second process step, a plasma gas including $NF_3$, $O_2$, and Ar is flowed into the processing region and ignited. A pressure sufficient to cause fluorine radicals to be formed from the plasma gas chemistry is the also applied within the processing region. For example, a pressure of 300 mTorr or more can be applied within the processing region. As described herein, the fluorine radicals within the plasma cause the modified silicon nitride to be isotropically and selectively etched with respect to underlying layers, such as silicon and silicon oxide. The surface modification to the silicon nitride layers during the first process step (Step 1) causes the modified silicon nitride to etched at a high rate compared to underlying layers, such as silicon or silicon oxide layers, during this second process step (Step 2). The plasma processing for this second process step is then stopped, and the processing region is evacuated to remove the plasma gas. As indicated by arrow 108, the first process step (Step 1) of block 104 and the second process step (Step 2) of block 106 can be repeated, as required, to remove a desired amount of silicon nitride. After this has occurred, block 110 is reached where the substrate is removed from the plasma processing region.

It is also noted that one or more additional process steps can be included with respect to embodiment 100 before and/or after sequential steps 104 and 106. It is also noted that the plasma processing region can be, for example, a plasma processing chamber. It is further noted that the silicon nitride layer can be implemented as silicon nitride (SiN) or a silicon nitride material that includes SiN along with one or more other elements. For example, as described below, the silicon nitride layer can be a SiBCN (Silicon Carbonitride/Boron Nitride) spacer. It is also noted that other plasma gas chemistries can also be used for Step 1 and Step 2 under sufficient pressure (e.g., 300 mTorr or greater) to generate hydrogen radicals and fluorine radicals. Other variations can also be implemented while still taking advantage of the radical-driven techniques described herein.

It is further noted that the increased pressure tends to reduce the ion energy due to increase in collisions in plasma sheath. As a result, process becomes more radical-driven with the increase in pressure.

Figure 1B:
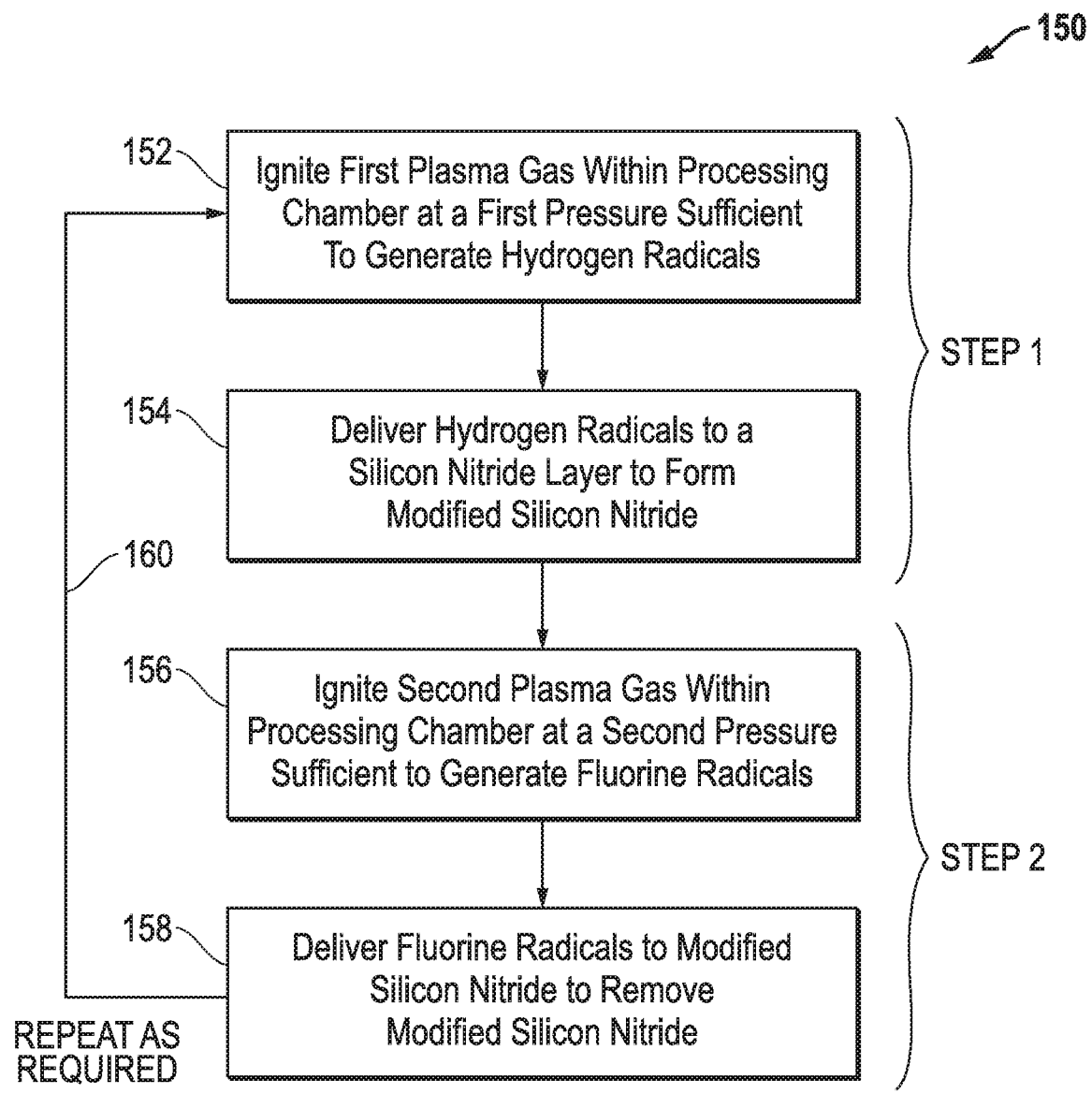
FIG. 1B is a further process flow diagram of an example embodiment where hydrogen radicals and fluorine radicals are used to modify and etch silicon nitride layers.

FIG. 1B is a further process flow diagram of an example embodiment 150 where hydrogen radicals and fluorine radicals are used to modify and etch silicon nitride layers. In block 152, a first plasma gas is ignited within a processing chamber at a first pressure sufficient to generate hydrogen radicals. In block 154, the hydrogen radicals are delivered to a silicon nitride layer to form modified silicon nitride. The silicon nitride layer, for example, can be formed on a substrate for a microelectronic workpiece positioned within the processing chamber. In block 156, a second plasma gas within the processing chamber is ignited at a second pressure sufficient to generate fluorine radicals. In block 158, the fluorine radicals are delivered to the modified silicon nitride to remove modified silicon nitride. As indicated by arrow 160, the process steps of blocks 152/154 (Step 1) and the process steps of blocks 156/158 (Step 2) can be repeated, as required, to remove a desired amount of silicon nitride. Additional and/or varied process steps can also be used with respect to embodiment 150 while still taking advantage of the techniques described herein to modify and remove silicon nitride layers.

Figure 2A:
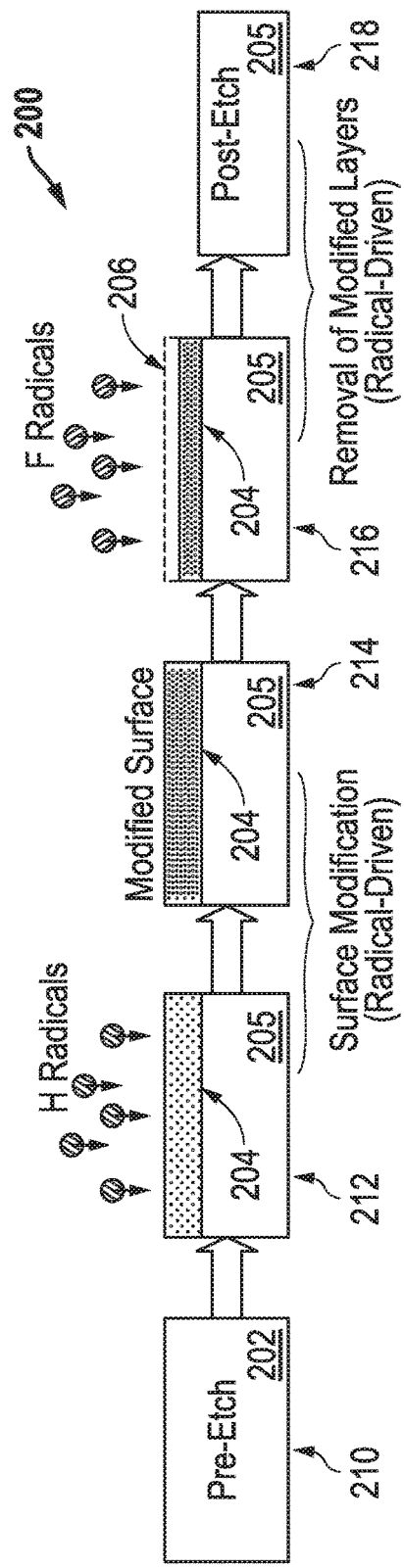
FIG. 2A is a diagram of an example embodiment for modifications made to a silicon nitride layer during the process steps described in FIGS. 1A-B.

FIG. 2A is a diagram of an example embodiment 200 for modifications made to a silicon nitride layer 202 during the process steps described in FIGS. 1A-B. For pre-etch as represented by view 210, the silicon nitride layer 202 has been exposed on the surface of the substrate. For the first process step (Step 1) as represented by view 212, the hydrogen (H) radicals modify the surface for the silicon nitride layer 202 within a surface region 204. After the first process step has completed and as represented by view 214, this radical-driven surface modification of the silicon nitride layer 202 leaves the modified surface region 204 and the non-modified region 205. For the second process step (Step 2) as represented by view 216, the fluorine (F) radicals remove the modified silicon nitride within the modified surface region 204. As represented by dashed line 206, a portion of the modified silicon nitride is removed as the second process step (Step 2) continues. Eventually, the entire modified silicon nitride is removed by the second process step (Step 2). After this process step has completed as represented by view 218, this radical-driven removal of the modified silicon nitride within the modified surface region 204 leaves post-etch only the silicon nitride within the non-modified region 205.

As described with respect to FIGS. 1A-B, the first and second process steps can be repeated to remove isotropically and selectively any desired amount of the silicon nitride layer 202 through sequential modification and removal steps. It is noted that the first process step tends to have a practical limit to the depth of modified nitride that can be generated with a single exposure of the silicon nitride layer to hydrogen radicals. As such, sequential use of the first and second process steps would typically be used to remove a selected or desired amount of the silicon nitride layer from the surface of a substrate for a microelectronic workpiece.

For one example embodiment, plasma processing equipment can be used that allows a selected plasma gas to be injected into a processing chamber and ignited. In addition, the plasma processing equipment allows a selected pressure (P) and temperature (T) to be applied within the processing chamber, a selected radio frequency (RF) energy to be applied to the processing chamber, and for a duration of the plasma processing steps to be controlled. For one example embodiment, the following parameters are used as set forth in the TABLE below. It is noted that the pressure is mTorr (mT); the temperature is degrees Celsius (C); the MW energy and RF energy are Watts (W); and the duration is seconds (sec). It is also noted that $O_2$ to $NF_3$ gas ratio (*/*) is preferably greater than four such that $O_2/NF_3>4$. The $O_2$ to $NF_3$ gas ratio (*/*) in other preferred embodiments is within a range from 2 to 5 such that $2 \leq O_2/NF_3 \leq 5$. Other variations and processing parameters may also be used while still taking advantage of the techniques described herein.

TABLE

EXAMPLE PLASMA PROCESS PARAMETERS

| Step | Gas | Gas Ratio | P | T | RF | Duration |
|---|---|---|---|---|---|---|
| Step 1 | $H_2$, Ar | 700H2/800Ar | 500 mT | 15 C. | 15-100 W | 15 sec |
| Step 2 | $NF_3$, $O_2$, Ar | *$O_2$/*$NF_3$/ 1000Ar | 500 mT | 15 C. | 15-100 W | 15 sec |

Figure 2B:
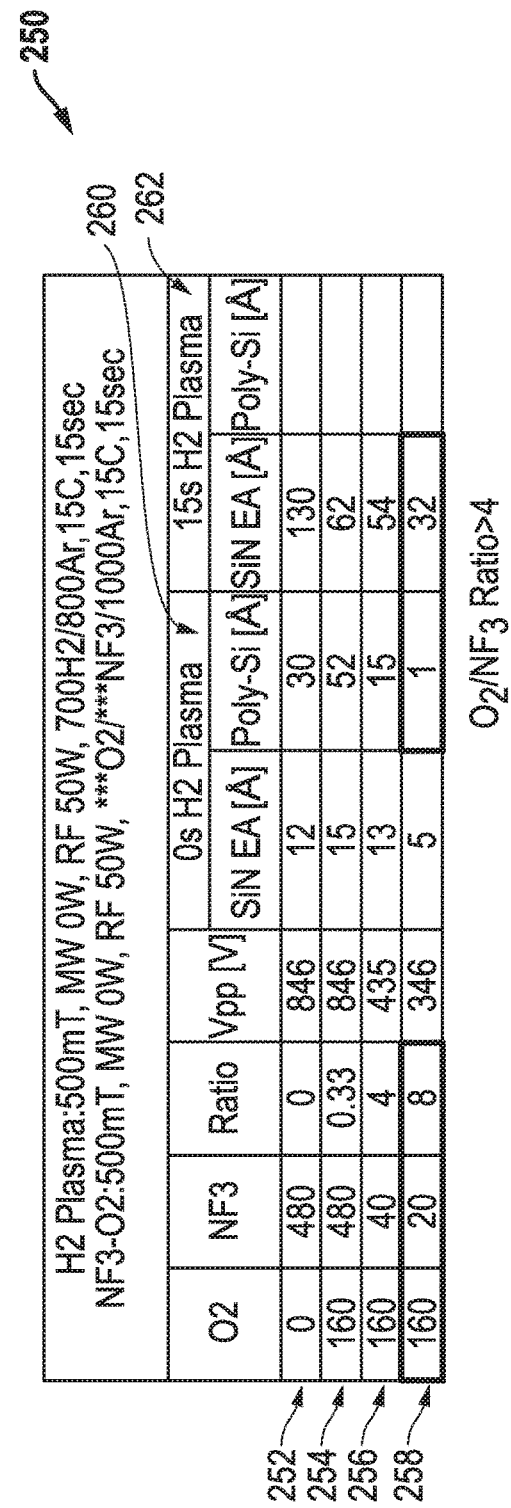
FIG. 2B is a chart of an example embodiment for different ratios used for the $O_2$ and the $NF_3$ gas ratios for the second process step (Step 2).

FIG. 2B is a chart of an example embodiment 250 for different ratios used for the $O_2$ and the $NF_3$ gas ratios for the second process step (Step 2). For this embodiment, the first step (Step 1) applies plasma process parameters similar to those in the TABLE above with the RF power set to 50 W. The second step (Step 2) applies plasma process parameters similar to those in the TABLE above with the RF power set to 50 W. For each row in FIG. 2B, however, different $O_2/NF_3$ gas ratios were used and the resulting etch depth is shown for silicon nitride (SiN) and polysilicon (Poly-Si) in Angstroms (Å). Results are provided for a first case 260 for the first step (Step 1) where zero seconds of $H_2$ plasma was used to generate H radicals (e.g., no surface modification of SiN layer), and results are provided for a second case 262 for the first step (Step 1) where 15 seconds of $H_2$ plasma was used to generate H radicals (e.g., create surface modification to SiN layer). The first row 252 represents an example where a $O_2/NF_3$ gas ratio of zero such that no oxygen was injected into the processing chamber. The second row 254 represents an example where a $O_2/NF_3$ gas ratio of 1/3 was injected into the processing chamber. The third row 256 represents an example where a $O_2/NF_3$ gas ratio of 4 was injected into the processing chamber. The fourth row 258 represents an example where a $O_2/NF_3$ gas ratio of 8 was injected into the processing chamber. As shown in the resulting etch data, it was found that a $O_2/NF_3$ gas ratio of greater than 4 provided significant improvements for etch selectivity for the etch of the silicon nitride material using two-step sequential processing with hydrogen and fluorine radicals as described herein.

Figure 3:
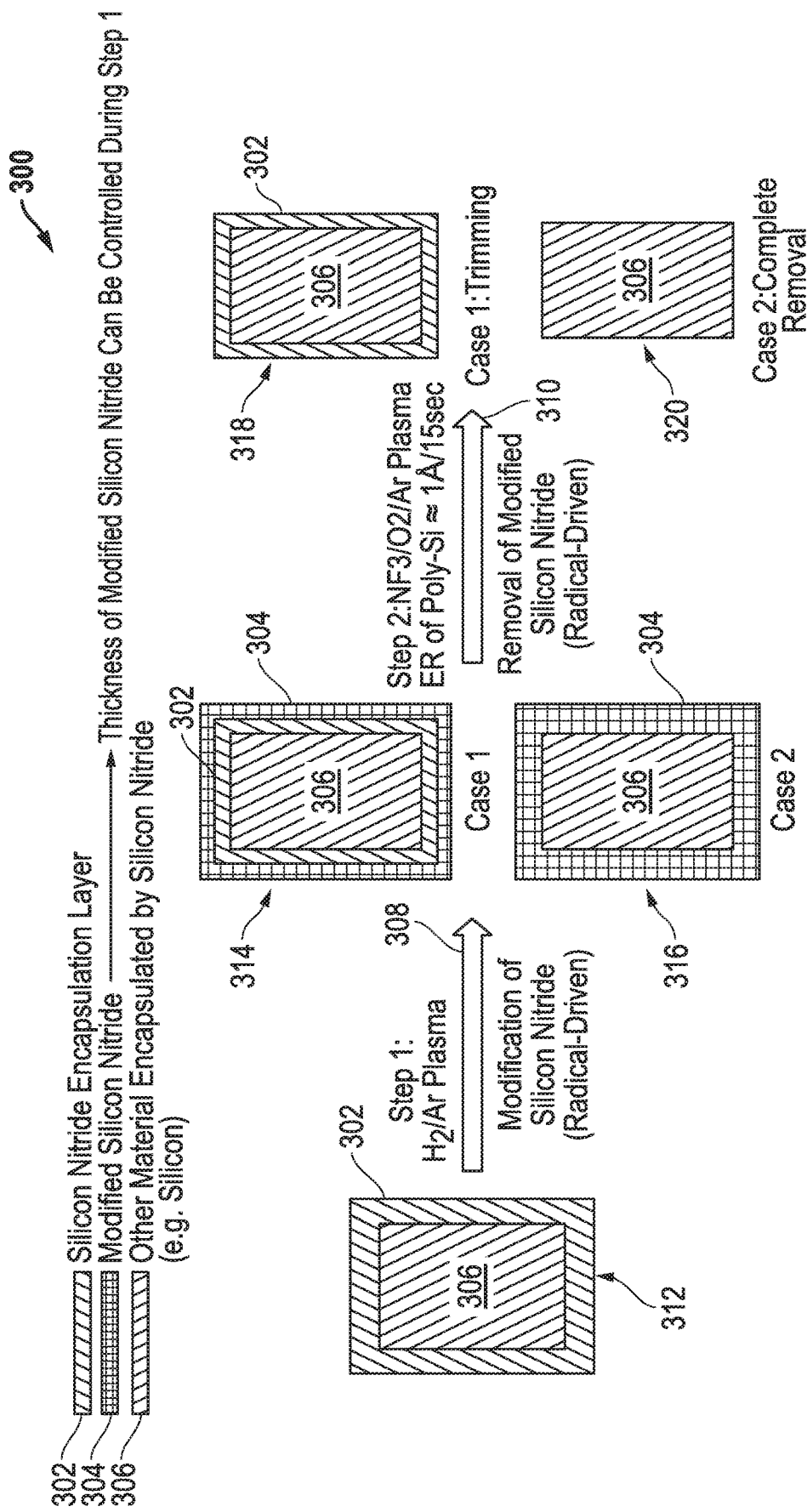
FIG. 3 is a diagram of an example embodiment where the etch techniques described herein are applied to remove a silicon nitride layer used as an encapsulation layer.

FIG. 3 is a diagram of an example embodiment 300 where the etch techniques described herein are applied to remove a silicon nitride layer used as an encapsulation layer 302. As shown in view 312, a silicon nitride encapsulation layer 302 surrounds and encapsulates a material 306 such as silicon. As represented by arrow 308, the first process step (Step 1) is applied to modify the silicon nitride encapsulation layer 302 and generate modified silicon nitride 304. As described herein, this first process step uses a plasma gas under conditions sufficient to form hydrogen (H) radicals, and this radical-driven process modifies the silicon nitride encapsulation layer 302 to generate the modified silicon nitride 304. The thickness of the modified silicon nitride 304 can be controlled during the first process step (Step). For example, as shown in view 314 with respect to a first case (Case 1—trim), only a portion of the silicon nitride encapsulation layer 302 has gone through modification to form modified silicon nitride 304. In contrast, as shown in view 316 with respect to a second case (Case 2—removal), the entire silicon nitride encapsulation layer 302 has gone through modification to form modified silicon nitride 304. As represented by arrow 310, the second process step (Step 2) is applied to remove the modified silicon nitride 304. As described herein, this second process step uses a plasma gas under conditions sufficient to form fluorine (F) radicals, and this radical-driven process removes the modified silicon nitride 304. As shown for view 318 with respect to Case 1, the silicon nitride encapsulation layer 302 has been trimmed by creating and removing the modified silicon nitride 304. As shown in view 320 with respect to Case 2, the silicon nitride encapsulation layer 302 has been completely removed by creating and removing the modified silicon nitride 304 to leave only the encapsulated material 306. Where polysilicon (poly-Si) is the encapsulated material 306, it is noted that the etch rate (ER) for the poly-Si is about 1 Å or less per 15 seconds, which represents a negligible loss of poly-Si.

Figure 4A:
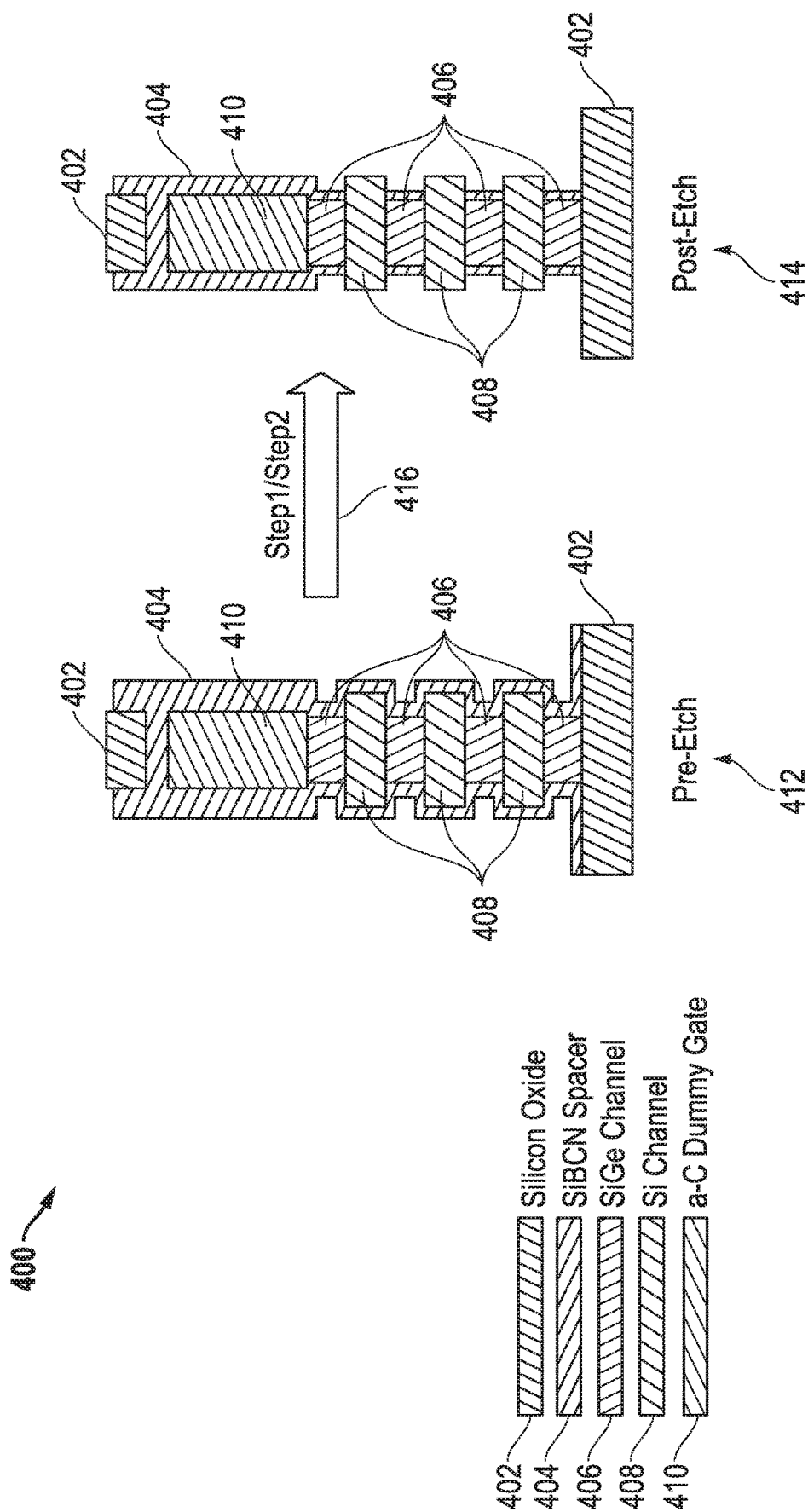
FIG. 4A is a diagram of an example embodiment where the etch techniques described herein are applied to open a nanosheet FET (field effect transistor).

FIG. 4A is a diagram of an example embodiment 400 where the etch techniques described herein are applied to open a nanosheet FET (field effect transistor). As shown in view 412, the pre-etch nanosheet structure includes silicon oxide 402, a SiBCN (Silicon Carbonitride/Boron Nitride) spacer 404, a SiGe (Silicon Germanium) channel 406, a Si (silicon) channel 408, and an a-C (amorphous carbon) dummy gate 410. As represented by arrow 416, the first and second process steps (Step 1, Step2) described herein are applied to create and remove modified silicon nitride with respect to the SiBCN spacer 404. As shown in the post-etch view 414, the SiBCN spacer 404 has been etched to open access to the Si channel 408. It is also noted that the radical-driven Step 1/Step 2 etch process is isotropic and selective to oxide and poly-Si.

Figure 4B:
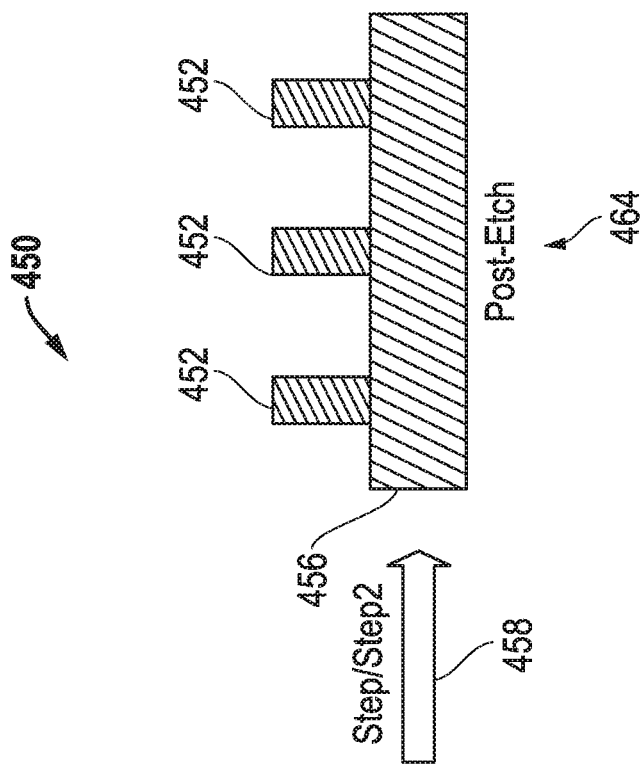
FIG. 4B is a diagram of an example embodiment where the etch techniques described herein are applied to remove a silicon nitride layer used as a liner.

FIG. 4B is a diagram of an example embodiment 450 where the etch techniques described herein are applied to remove a silicon nitride layer used as a liner 454. As shown in pre-etch view 462, the pre-etch structure includes structures 452, such as silicon oxide structures, that have silicon nitride liners 454. The structures 452 and liners 454 have been formed over an underlying layer 456, such as a silicon substrate or one or more layers formed on a silicon substrate. As represented by arrow 458, the first and second process steps (Step 1, Step2) described herein are applied to create and remove modified silicon nitride with respect to the liners 454. As shown in the post-etch view 464, the silicon nitride liners 454 have been etched to leave the structures 452. Other variations could also be implemented while using the etch techniques described herein to remove a silicon nitride layer used as a liner.

FIG. 5A (Prior Art) is a diagram of an example embodiment 500 for a current process that etches a silicon nitride layer that is used as a contact etch stop layer (CESL). As shown for embodiment 500, epi fins 502 are included along with silicon oxide layers 512. For current etch approaches, when the CESL layer 504 is removed, significant epi loss occurs with respect to the exposed epi fins 502 as represented by arrow 511.

FIG. 5B is a diagram of an example embodiment 515 for a process according to the embodiments described herein that etches a silicon nitride layer used as a CESL. As shown for embodiment 500, epi fins 502 are included along with silicon oxide layers 512. For the radical-driven processes described herein, when the CESL layer 504 is removed, no epi loss or negligible epi loss occurs with respect to the exposed epi fins 502 as represented by arrow 516.

Figure 5C:
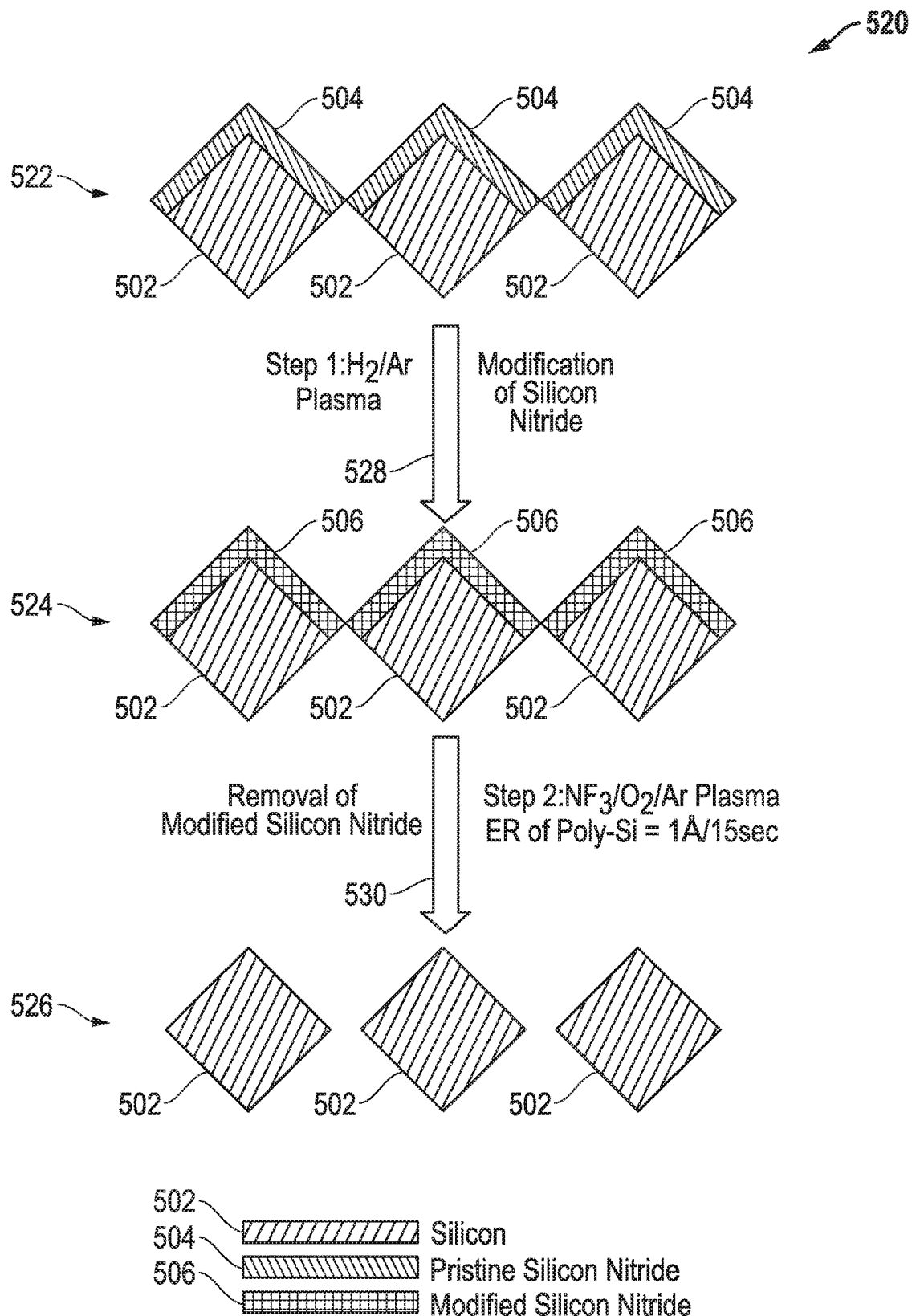
FIG. 5C is a diagram of an example embodiment where the etch techniques described herein are applied to remove the silicon nitride CESL.

FIG. 5C is a diagram of an example embodiment 520 where the etch techniques described herein are applied to remove the silicon nitride CESL. As shown in view 522, a silicon nitride CESL layer 504 covers the epi fins 502. As represented by arrow 528, the first process step (Step 1) is applied to modify the silicon nitride CESL layer 504 and generate modified silicon nitride 506. The result of this first process step (Step 1) is shown in view 524. As described herein, this first process step uses a plasma gas under sufficient conditions to form H radicals, and this radical-driven process modifies the silicon nitride CESL layer 504 to generate the modified silicon nitride 506. As represented by arrow 530, the second process step (Step 2) is applied to remove the modified silicon nitride 506 and leave epi fins 502. The result of this second process step (Step 2) is shown in view 526. As described herein, this second process step uses a plasma gas under sufficient conditions to form F radicals, and this radical-driven process removes the modified silicon nitride 506. Where epitaxial silicon germanium is used for the epi fins 502, it is noted that the etch rate (ER) for the silicon is about 1 Å or less per 15 seconds.

It is noted that one or more deposition processes can be used to form the material layers described herein. For example, one or more depositions can be implemented using chemical vapor deposition (CVD), plasma enhanced CVD (PECVD), physical vapor deposition (PVD), atomic layer deposition (ALD), and/or other deposition processes. For a plasma deposition process, a precursor gas mixture can be used including but not limited to hydrocarbons, fluorocarbons, or nitrogen containing hydrocarbons in combination with one or more dilution gases (e.g., argon, nitrogen, etc.) at a variety of pressure, power, flow and temperature conditions. Lithography processes with respect to PR layers can be implemented using optical lithography, extreme ultraviolet (EUV) lithography, and/or other lithography processes. The etch processes can be implemented using plasma etch processes, discharge etch processes, and/or other desired etch processes. For example, plasma etch processes can be implemented using plasma containing fluorocarbons, oxygen, nitrogen, hydrogen, argon, and/or other gases. In addition, operating variables for process steps can be controlled to ensure that CD target parameters for vias are achieved during via formation. The operating variables may include, for example, the chamber temperature, chamber pressure, flowrates of gases, frequency and/or power applied to electrode assembly in the generation of plasma, and/or other operating variables for the processing steps. Variations can also be implemented while still taking advantage of the techniques described herein.

Figure 6:
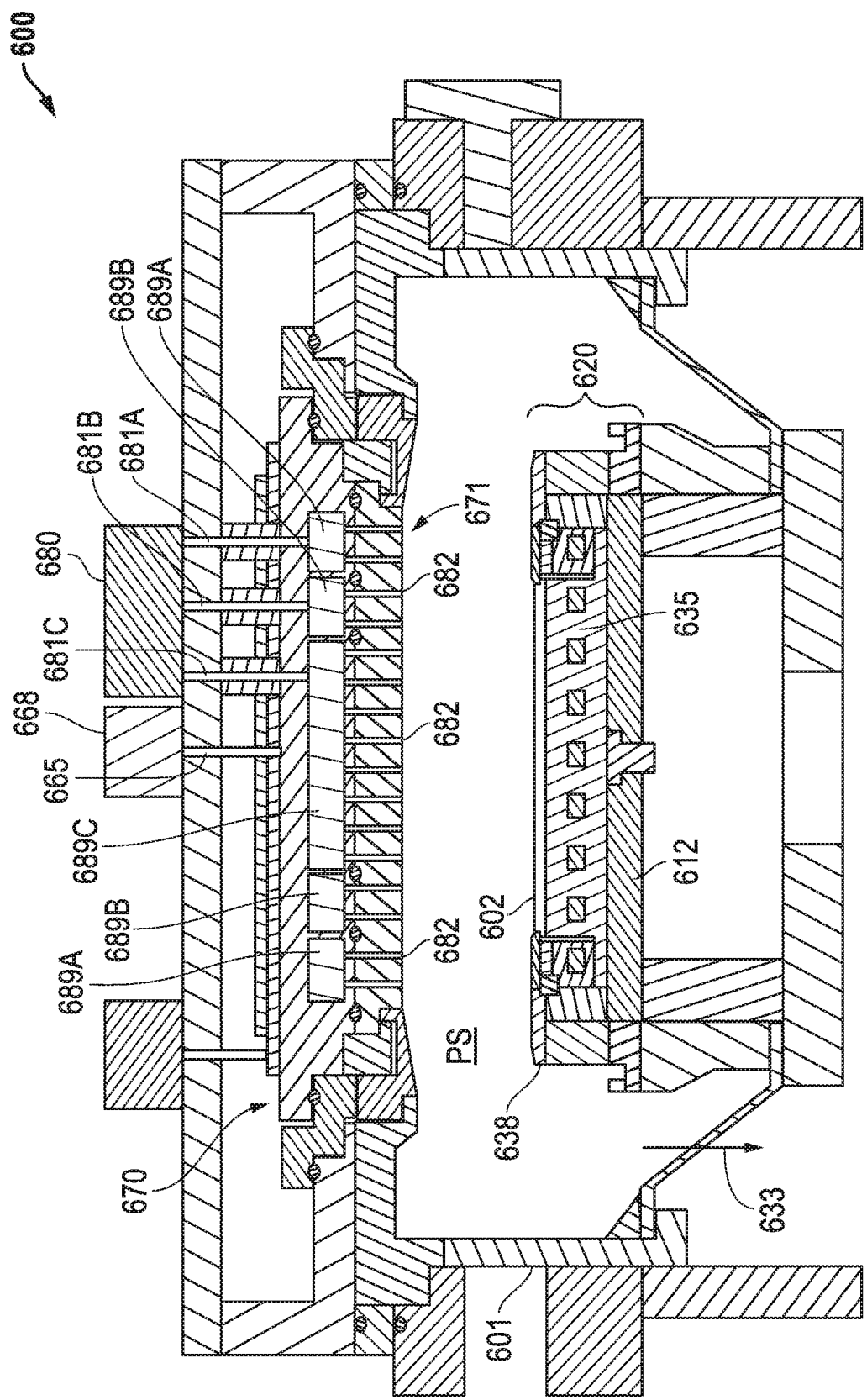
FIG. 6 is a block diagram of an example embodiment for a workpiece manufacturing system, such as a plasma processing apparatus, that can be used as an etch chamber for the embodiments described herein.

An embodiment 600 for an example plasma etch processing system is described with respect to FIG. 6. It is noted, however, that the techniques described herein may be utilized with a wide range of etch processing systems, and the embodiment 600 is simply one example embodiment.

FIG. 6 is a block diagram of an example embodiment 600 for a workpiece manufacturing system, such as a plasma processing apparatus, that can be used as an etch chamber for the embodiments described herein. More particularly, FIG. 6 illustrates one example embodiment for a plasma processing apparatus merely for illustrative purposes that can be used to implement the processing techniques described herein. It will be recognized that other plasma process systems and other etch process systems may equally implement the techniques described herein. For the example embodiment 600 of FIG. 6, a schematic cross-sectional view is provided for a capacitively coupled plasma processing apparatus including a process space (PS) that provides an etch chamber for microelectronic workpieces. Alternative plasma process apparatus may also be utilized, including for example, but not limited to, inductively coupled plasma processing apparatus, microwave plasma processing apparatus, and the like. A capacitively coupled plasma processing apparatus may be particularly well suited as the electrode spacing of such apparatus allow beneficial control of gases to a localized region of the plasma space, thus providing localized plasma processing on the substrate.

The plasma processing apparatus 600 can be used for multiple operations including ashing, etching, deposition, cleaning, plasma polymerization, plasma-enhanced chemical vapor deposition (PECVD), atomic layer deposition (ALD) and so forth. The structure of a plasma processing apparatus 600 is well known, and the particular structure provided herein is merely exemplary. Plasma processing can be executed within processing chamber 601, which can be a vacuum chamber made of a metal such as aluminum or stainless steel. The processing chamber 601 defines a processing vessel providing a process space (PS) for plasma generation. An inner wall of the processing vessel can be coated with alumina, yttria, or other protectant. The processing vessel can be cylindrical in shape or have other geometric configurations.

At a lower, central area within the processing chamber 601, a susceptor 612 (which can be disc-shaped) can serve as a mounting table on which, for example, a substrate 602 to be processed (such as a semiconductor wafer) can be mounted. Substrate 602 can be moved into the processing chamber 601 through a loading/unloading port and gate valve. Susceptor 612 forms part of a lower electrode assembly 620 as an example of a second electrode acting as a mounting table for mounting substrate 602 thereon. The susceptor 612 can be formed of, e.g., an aluminum alloy. Susceptor 612 is provided thereon with an electrostatic chuck (as part of the lower electrode assembly) for holding the substrate 602. The electrostatic chuck is provided with an electrode 635. Electrode 635 is electrically connected to direct current (DC) power source, not shown. The electrostatic chuck attracts the substrate 602 thereto via an electrostatic force generated when DC voltage from the DC power source is applied to the electrode 635. The susceptor 612 can be electrically connected with a high-frequency power source via a matching unit. For other embodiments and processing chambers, two or more power sources can be used and connected to electrode 635 and/or other electrodes within the processing chambers. This high-frequency power source (a second power source) can output a high-frequency voltage in a range from, for example, 2 MHz (megahertz) to 20 MHz. Applying high frequency bias power causes ions, in plasma generated in the processing chamber 601, to be attracted to substrate 602. A focus ring assembly 638 is provided on an upper surface of the susceptor 612 to surround the electrostatic chuck.

An exhaust path 633 can be formed through one or more exhaust ports (not shown) which connect to a gas exhaust unit. The gas exhaust unit can include a vacuum pump such as a turbo molecular pump configured to pump out the plasma processing space within the processing chamber 601 to a desired vacuum condition. The gas exhaust unit evacuates the inside of the processing chamber 601 thereby depressurizing the inner pressure thereof down to the desired degree of vacuum.

An upper electrode assembly 670 is an example of a first electrode and is positioned vertically above the lower electrode assembly 620 to face the lower electrode assembly 620 in parallel. The plasma generation space or process space (PS) is defined between the lower electrode assembly 620 and the upper electrode assembly 670. The upper electrode assembly 670 includes an inner upper electrode 671, having a disk shape, and an outer upper electrode which may be annular and surrounding a periphery of the inner upper electrode 671. The inner upper electrode 671 also functions as a processing gas inlet for injecting a specific amount of processing gas into the process space (PS) above substrate 602 mounted on the lower electrode assembly 620. The upper electrode assembly 670 thereby forms a showerhead. More specifically, the inner upper electrode 671 includes gas injection openings 682.

The upper electrode assembly 670 may include one or more buffer chamber(s) 689A, 689B, and 689C. The buffer chambers are used for diffusing process gas and can define a disk-shaped space. Processing gas from a process gas supply system 680 supplies gas to the upper electrode assembly 670. The process gas supply system 680 can be configured to supply a processing gas for performing specific processes, such as film-forming, etching, and the like, on the substrate 602. The process gas supply system 680 is connected to gas supply lines 681A, 681B, and 681C forming a processing gas supply path. The gas supply lines are connected to the buffer chambers of the inner upper electrode 671. The processing gas can then move from the buffer chambers to the gas injection openings 682 at a lower surface thereof. A flow rate of processing gas introduced into the buffer chambers 689A-C can be adjusted by, e.g., by using a mass flow controller. Further, the processing gas introduced is discharged from the gas injection openings 682 of the electrode plate (showerhead electrode) to the process space (PS). The inner upper electrode 671 functions in part to provide a showerhead electrode assembly.

As shown in FIG. 6, three buffer chambers 689A, 689B, and 689C are provided corresponding to edge buffer chamber 689A, middle buffer chamber 689B, and center buffer chamber 689C. Similarly, gas supply lines 681A, 681B, and 681C may be configured as edge gas supply line 681A, middle gas supply line 681B and center gas supply line 681C. The buffer chambers are provided in a manner corresponding to different localized regions of the substrate in this case edge, middle and center. As will be discussed more below, these regions may correspond to specific process plasma process conditions for localized regions of the substrate 602. It will be recognized that the use of three localized regions is merely exemplary. Thus, the plasma processing apparatus may be configured to provided localize plasma process conditions on any number of regions of the substrate. It is further again noted that any of a variety of configurations may be utilized, and the techniques described herein are not limited to the manner in which the process gas supply system 680 is configured to split the gas flows to the various buffer chambers.

The upper electrode assembly 670 is electrically connected with a high-frequency power source (not shown) (first high-frequency power source) via a power feeder 665 and a matching unit 668. The high-frequency power source can output a high-frequency voltage having a frequency of 40 MHz (megahertz) or higher (e.g., 60 MHz), or can output a very high frequency (VHF) voltage having a frequency of 30-300 MHz. This power source can be referred to as the main power supply as compared to a bias power supply. It is noted for certain embodiments there is no power source for the upper electrodes, and two power sources are connected to the bottom electrode. Other variations could also be implemented.

Components of the plasma processing apparatus can be connected to, and controlled by, a control unit, which in turn can be connected to a corresponding memory storage unit and user interface (all not shown). Various plasma processing operations can be executed via the user interface, and various plasma processing recipes and operations can be stored in a storage unit. Accordingly, a given substrate can be processed within the plasma processing chamber with various microfabrication techniques. In operation, the plasma processing apparatus uses the upper and lower electrodes to generate a plasma in the process space (PS). This generated plasma can then be used for processing a target substrate (such as substrate 602 or any material to be processed) in various types of treatments such as plasma etching, chemical vapor deposition, treatment of semiconductor material, glass material and large panels such as thin-film solar cells, other photovoltaic cells, and organic/inorganic plates for flat panel displays, etc.

It is noted that reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

"Microelectronic workpiece" as used herein generically refers to the object being processed in accordance with the invention. The microelectronic workpiece may include any material portion or structure of a device, particularly a semiconductor or other electronics device, and may, for example, be a base substrate structure, such as a semiconductor substrate or a layer on or overlying a base substrate structure such as a thin film. Thus, workpiece is not intended to be limited to any particular base structure, underlying layer or overlying layer, patterned or unpatterned, but rather, is contemplated to include any such layer or base structure, and any combination of layers and/or base structures. The description below may reference particular types of substrates, but this is for illustrative purposes only and not limitation.

The term "substrate" as used herein means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

Systems and methods for processing a microelectronic workpiece are described in various embodiments. One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Further modifications and alternative embodiments of the described systems and methods will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the inventions are described herein with reference to specific embodiments, various modifications and changes can be made without departing from the scope of the present inventions. Accordingly, the specification and figures are to be regarded in an illustrative rather than a restrictive sense, and such modifications are intended to be included within the scope of the present inventions. Further, any benefits, advantages, or solutions to problems that are described herein with regard to specific embodiments are not intended to be construed as a critical, required, or essential feature or element of any or all the claims.

What is claimed is:

1. A method of processing microelectronic workpieces, comprising:
   providing a substrate in a processing chamber including a silicon nitride layer and a covered layer covered by the silicon nitride layer, the covered layer covered by the silicon nitride layer comprising silicon and is a different material than the silicon nitride layer;
   igniting a first plasma gas within a processing chamber at a first pressure sufficient to generate hydrogen radicals;
   delivering the hydrogen radicals to the silicon nitride layer formed on the substrate in the processing chamber to form a modified silicon nitride layer, the modified silicon nitride layer having a surface modification caused by the hydrogen radicals and having a higher reactivity to fluorine radicals than the silicon nitride layer;
   after forming the modified silicon nitride layer, igniting a second plasma gas within the processing chamber at a second pressure sufficient to generate fluorine radicals; and
   delivering the fluorine radicals to the modified silicon nitride layer to remove the modified silicon nitride layer and at least partially expose the covered layer with the removal of the modified silicon nitride layer selective with respect to the covered layer.

2. The method of claim 1, wherein a duration of the fluorine radicals to remove the modified silicon nitride layer is controlled so that all of the modified silicon nitride layer is removed.

3. The method of claim 1, wherein an etch selectivity for the modified silicon nitride layer to the covered layer is at least 30 or greater while the fluorine radicals remove the modified silicon nitride layer.

4. The method of claim 1, further comprising evacuating the first plasma gas from the processing chamber and injecting the second plasma gas into the processing chamber prior to the igniting of the second plasma gas.

5. The method of claim 1, wherein the silicon nitride layer is formed as at least one of an encapsulation layer, a liner or an etch stop layer to protect the covered layer on the substrate, and wherein the covered layer exposed in the removal of the modified silicon nitride layer includes one of silicon oxide, polysilicon, epitaxial silicon or silicon germanium.

6. The method of claim 1:
wherein the covered layer is epitaxial silicon, and prior to forming the modified silicon nitride layer: (a) the silicon nitride layer is covered by a silicon oxide layer; and (b) the silicon oxide layer is removed by etching and during etching of the silicon oxide layer the silicon nitride layer covers and protects the epitaxial silicon; and
wherein after etching of the silicon oxide layer, (c) the forming of the modified silicon nitride layer and removal of the modified silicon nitride layer are performed to expose the epitaxial silicon while suppressing removal or damage to the expitaxial silicon by way of the removal of the silicon nitride layer with the first and second plasma gases.

7. The method of claim 1, wherein:
the covered layer includes a first plurality of channels and a second plurality of channels of a nanosheet field effect transistor (FET), wherein prior to forming the modified silicon nitride layer, the silicon nitride layer covers both the first plurality of channels and the second plurality of channels, and
removal of the modified silicon nitride layer removes the modified silicon nitride layer from the first plurality of channels such that the first plurality of channels are exposed, while the second plurality of channels remain covered after the removal.

8. The method of claim 1, wherein a duration for the allowing the hydrogen radicals to modify the silicon nitride layer is controlled to determine an amount of the silicon nitride layer that is modified to form the modified silicon nitride layer.

9. The method of claim 8, wherein the duration is 15 seconds or more.

10. The method of claim 1, wherein the silicon nitride layer is formed to provide a spacer for a nanosheet field effect transistor.

11. The method of claim 10, wherein the silicon nitride layer for the spacer comprises silicon carbonitride/boron nitride (SiBCN).

12. The method of claim 1, wherein the silicon nitride layer is formed as a contact etch stop layer (CESL) to protect a fin structure.

13. The method of claim 12, wherein the fin structure comprises epitaxial silicon.

14. The method of claim 1, wherein the second plasma gas is formed with a gas mixture including an oxygen containing gas and a fluorine containing gas at a ratio such that an etch rate of the modified silicon nitride layer is higher than an etch rate for a material of the covered layer upon exposure to the second plasma gas.

15. The method of claim 14, wherein the covered layer is epitaxial silicon, and the epitaxial silicon layer etches at an etch rate of 1 Angstrom or less per 15 seconds upon exposure to the second plasma gas.

16. The method of claim 1, wherein the first pressure is 300 milli-Torr (mTorr) or greater.

17. The method of claim 16, wherein the first plasma gas comprises hydrogen ($H_2$) and argon (Ar).

18. The method of claim 17, wherein a volumetric flow rate ratio of $H_2$ to Ar within the first plasma gas is 700/800 and the first pressure is 500 mTorr or greater.

19. The method of claim 1, wherein the second pressure is 300 mTorr or greater.

20. The method of claim 19, wherein the second plasma gas comprises oxygen ($O_2$), nitrogen trifluoride ($NF_3$), and argon (Ar).

21. The method of claim 20, wherein a volumetric flow rate ratio of $O_2$ to $NF_3$ is at least one of a ratio greater than four such that $O_2/NF_3 > 4$ or a ratio between 2 and 5 such that $2 \leq O_2/NF_3 \leq 5$.

* * * * *